(12) United States Patent  
Chiang

(10) Patent No.: US 8,699,270 B2  
(45) Date of Patent: *Apr. 15, 2014

(54) SYSTEM AND METHOD FOR CONTROLLING VOLTAGE RAMPING FOR AN OUTPUT OPERATION IN A SEMICONDUCTOR MEMORY DEVICE

(71) Applicant: Macronix International Co., Ltd., Hsinchu (TW)

(72) Inventor: Ju-An Chiang, Hsinchu (TW)

(73) Assignee: Macronix International Co., Ltd. (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/953,552

(22) Filed: Jul. 29, 2013

(65) Prior Publication Data

US 2014/0035659 A1    Feb. 6, 2014

Related U.S. Application Data

(63) Continuation of application No. 12/906,661, filed on Oct. 18, 2010, now Pat. No. 8,498,158.

(51) Int. Cl.  
*G11C 16/04* (2006.01)

(52) U.S. Cl.  
USPC ............. 365/185.18; 365/185.27; 365/189.09

(58) Field of Classification Search  
USPC ........................... 365/185.18, 185.27, 189.09  
See application file for complete search history.

(56) References Cited

U.S. PATENT DOCUMENTS

| | | | |
|---|---|---|---|
| 5,495,453 A | 2/1996 | Wojciechowski et al. | |
| 5,955,874 A | 9/1999 | Zhou et al. | |
| 6,107,866 A | 8/2000 | Migliavacca | |
| 6,348,835 B1 | 2/2002 | Sato et al. | |
| 6,359,809 B1 * | 3/2002 | Tedrow et al. | 365/185.21 |
| 6,724,244 B2 | 4/2004 | Wu | |
| 6,813,194 B2 * | 11/2004 | Tran et al. | 365/189.09 |
| 6,927,622 B2 | 8/2005 | Rashid et al. | |
| 6,944,077 B2 * | 9/2005 | Morikawa | 365/204 |
| 6,977,849 B2 * | 12/2005 | Tomishima | 365/189.09 |
| 7,359,254 B2 * | 4/2008 | Takeda | 365/189.09 |
| 8,498,158 B2 * | 7/2013 | Chiang | 365/185.18 |
| 2008/0043533 A1 | 2/2008 | Isobe | |
| 2009/0237992 A1 | 9/2009 | Maejima | |
| 2009/0295465 A1 | 12/2009 | Tripodi et al. | |
| 2010/0034025 A1 | 2/2010 | Yanagidaira et al. | |
| 2010/0054045 A1 | 3/2010 | Ho et al. | |

* cited by examiner

*Primary Examiner* — Pho M Luu  
(74) *Attorney, Agent, or Firm* — Baker & McKenzie LLP

(57) ABSTRACT

A voltage driving circuit comprises a current bias generating unit and a voltage driving unit. The current bias generating unit is configured to receive a mode signal and to generate a mode selection current in response to the mode signal. The voltage driving unit is coupled to the current bias generating unit, and is configured to receive the mode selection current and to drive an output voltage at a slew rate that is set according to the mode selection current. The voltage driving unit can include a plurality of stages, where each stage is configured to drive the output voltage at a respective different slew rate according to the mode signal.

20 Claims, 6 Drawing Sheets

SYSTEM AND METHOD FOR CONTROLLING VOLTAGE RAMPING FOR AN OUTPUT OPERATION IN A SEMICONDUCTOR MEMORY DEVICE

CROSS-REFERENCE TO RELATED APPLICATIONS

This is a continuation application and claims priority to U.S. patent application Ser. No. 12/906,661, filed Oct. 18, 2010, entitled "SYSTEM AND METHOD FOR CONTROLLING VOLTAGE RAMPING FOR AN OUTPUT OPERATION IN A SEMICONDUCTOR MEMORY DEVICE," now U.S. Pat. No. 8,498,158, which is commonly-assigned and incorporated herein by reference for all purposes.

BACKGROUND

1. Technical Field

The present application relates to semiconductor memory devices, including systems and methods for controlling voltage levels associated with output operations of semiconductor memory devices.

2. Related Art

Semiconductor memory devices are known that are capable of storing bits of data in a memory array. For example, NAND flash memories include an array of memory cells for storing data. FIG. 1A shows a block diagram of some basic components of a typical NAND flash memory device 100. The memory device 100 includes a memory array 102, which includes some number "i" of memory strings MS1-MSi. Each of the memory strings MS1-MSi includes a respective group of "j" memory cells that are connected in series between a common source line and a respective one of bit lines BL1-BLi. Thus, the memory array 102 includes an i by j array of memory cells, where i and j are integers that can vary depending on the capacity of the memory array 102.

Each of the memory strings MS1-MSi includes an equal number j of series-connected floating gate transistors (not shown), each of which constitutes a respective memory cell. The gate of each of the floating gate transistors is controlled by a respective one of the word lines WL1-WLj according to signals from a row decoder 104. The word lines WL1-WLj connect to all of the memory strings MS1-MSi; each of the word lines WL1-WLj controls the gate of a respective floating gate transistor in each of the memory strings MS1-MSi.

A string select line SSL and a ground select line GSL also connect to all of the memory strings MS1-MSi. Each of the memory strings MS1-MSi includes a respective string select transistor (not shown) and a respective ground select transistor (not shown). The string select line SSL controls the string select transistors of the memory strings MS1-MSi; the ground select line GSL controls the ground select transistors of the memory strings MS1-MSi. The string select transistors control the connections between the memory strings MS1-MSi and their respective bit line BL1-BLi; the ground select transistors control the connections between the memory strings MS1-MSi and the common source line.

The voltage level of the source line is controlled by a source line control circuit 106. The respective voltage levels of the bit lines BL1-BLi are controlled by respective sense amplifiers 108a-108i and clamp transistors CT1-CTi. The applied voltage levels can vary depending on the type of operation that is being performed on the memory cells. Examples of typical operations include read and write operations, where the write operations can differ depending on whether a memory cell is being programmed or erased.

It takes some amount of time to bring the various control lines to the respective voltage levels needed to perform the various operations involving memory cells of the memory array 102. So, some devices are configured to maintain some minimum voltage level, for example on the bit lines BL1-BLi, so that the amount of time needed to perform various operations can be reduced. However, for many electronic devices, power consumption is an important issue. Maintaining such minimum voltage levels may serve to speed up memory processes, but it suffers the disadvantage of consuming additional electrical power. So, for example, in devices that primarily rely upon battery power, this increase in power consumption may advantageously provide for faster memory, but it does so at the cost of reduced battery life.

Such issues are well-known, and have resulted in a variety of schemes involving "standby" modes while still periodically pre-charging various control lines. For example, in the memory device 100 shown in FIG. 1, a bit line driver 110 can provide a bit-line clamp signal BLCLAMP to the clamp transistors CT1-CTi in order to allow voltages from the respective sense amplifiers 108a-108i to pre-charge bit lines BL1-BLi in anticipation of an upcoming read operation. The sense amplifiers 108a-108i are provided with a supply voltage $V_{DD}$, which is selectively applied to the respective bit lines BL1-BLi depending upon the condition of the respective clamp transistors CT1-CTi.

Referring to FIG. 1B, before a bit line BL is pre-charged, the sense-amplifier side of the clamp transistor CT (i.e., the drain) is at a voltage level equivalent to $V_{DD}$, while the gate is at 0 volts and the bit-line side (i.e., the source) is at 0 volts or floating. As shown in FIG. 1C, it is well known that MOSFET transistors include a number of intrinsic coupling capacitances, including a gate to source capacitance represented in FIG. 1C as capacitor $C_{GS}$. The bit-line clamp signal BLCLAMP and resulting bit line voltage are shown in FIG. 1D. These signals have a very steep transition, allowing for quickly pre-charging the bit line. However, the gate to source capacitance $C_{GS}$ causes some amount of reverse coupling of the bit-line clamp signal BLCLAMP. As a result, the actual BLCLAMP voltage will increase from an expected voltage level (shown by the solid line) to a higher actual level (shown by the broken line). As a result, the bit-line clamp signal BLCLAMP strays higher than the design target level. Also, as shown in FIG. 1D, the bit line pre-charge voltage level will likewise stray higher than the design target level. Thus, the coupling capacitance of the MOSFET can cause incorrect voltage levels to occur within the memory device, which in turn can lead to errors during memory operations.

Also, depending on the operation being performed, the voltage levels of neighboring bit lines BL1-BLi may differ. For example, during a read operation, one bit line may be raised to 0.7 volts, while a neighboring bit line is at ground (0 volts). As semiconductor devices have been reduced in scale, the distance between neighboring bit lines has been reduced as well. As a result, the voltage differences between neighboring lines, such as neighboring bit lines, can result in a coupling effect, which basically means that the voltage on one bit line can influence the voltage level of another bit line. The coupling effect is an undesirable aspect of memory devices, because it can cause errors in read and write operations of the memory.

As a result, it is desirable to find ways of reducing and eliminating unwanted effects due to capacitive coupling within the MOSFET, as well as elsewhere such as between neighboring control lines.

SUMMARY

Disclosed herein is a system and method for controlling the ramp-up speed of a pre-charge voltage of bit lines of a memory device. The disclosed systems and methods can include embodiments that allow for varying the ramp-up speed. For example, according to some embodiments, a voltage driving circuit can include a current bias generating unit and a voltage driving unit coupled to the current bias generating unit. The current bias generating unit can be configured to receive a mode signal, and to generate a mode selection current in response to the mode signal. The voltage driving unit can be configured to receive the mode selection current, and to drive an output voltage at a slew rate that is set according to the mode selection current.

According to some embodiments, the mode signal can include n bits, where n is an integer greater than 1. In some such embodiments, the voltage driving unit can be configured to receive the mode signal. The voltage driving unit can be configured to drive the output voltage at the slew rate corresponding to one of n operation modes, wherein each of the n operation modes allows for a respective different slew rate.

In some embodiments, the current bias generating unit can include a control voltage unit, a mode selecting unit, and a current driving unit. The control voltage unit can be configured to generate a driving current and a control voltage. The mode selecting unit can be configured to receive the mode signal and output a mode selection signal. The current driving unit can be configured to receive the mode selection signal and to generate one of a plurality of possible mode selection currents based on the mode selection signal. In some such embodiments, the plurality of mode selection currents can include first and second mode selection currents, where the current driving unit can include first and second transistors having respective first and second aspect ratios, and where each of the first and second transistors can be configured to drive a respective one of the first and second mode selection currents. The control voltage unit can include a current mirror circuit configured to generate the driving current. Also, the respective magnitudes of the first and second mode selection currents can be related to the magnitude of the driving current and the aspect ratio of the respective one of the first and second transistors.

In some embodiments, the voltage driving unit can include a current mirror opamp-based regulator. In some such embodiments, the voltage driving unit can include a plurality of stages, and the slew rate can depend on which of the stages is activated by the mode signal.

In some embodiments, the voltage driving circuit can further comprise a second voltage driving unit coupled to the current bias generating unit. The current bias generating unit can be further configured generate a second mode selection current in response to the mode signal. The second voltage driving unit can be configured to receive the second mode selection current and to drive an output voltage at a second slew rate that is set according to the second mode selection current.

In some embodiments, the voltage driving unit can include a plurality of stages, where each stage can be configured to drive an output voltage at a respective one of a plurality of different slew rates according to respective portions of the mode signal.

BRIEF DESCRIPTION OF THE DRAWINGS

Features, aspects, and embodiments of the inventions are described in conjunction with the attached drawings, in which.

DETAILED DESCRIPTION

Disclosed herein is a system and method for controlling the ramp-up speed of a pre-charge voltage of bit lines of a memory device. The disclosed systems and methods can include embodiments that allow for varying the ramp-up speed. Reducing the ramp-up speed of the pre-charge voltage level of a bit line provides an effective way of alleviating the unwanted MOSFET coupling effect, thereby reducing or eliminating the voltage increases shown in FIG. 1D. However, slowing down the pre-charge slew rate for the sake of reducing the coupling effect also means that the memory operations are slowed down. So, for operations where the coupling effect is less of a concern, or not a concern, the pre-charge rate can be increased; for operations where the coupling effect is more of a concern, the pre-charge slew rate can be decreased.

Figure 2:
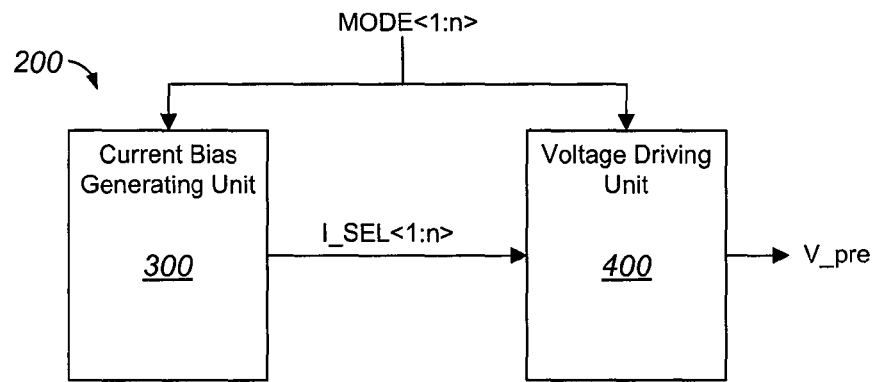
FIG. 2 shows a block diagram of an output voltage driving circuit of a semiconductor memory apparatus.

FIG. 2 shows a block diagram of an output voltage driving circuit 200 of a semiconductor memory apparatus. In FIG. 2, the voltage driving circuit 200 can include a current bias generating unit 300 and a voltage driving unit 400.

The current bias generating unit 300 can be configured to output one of a plurality of mode selection currents I_SEL<1:n> in response to a mode signal MODE<1:n>, where n is an integer, preferably greater than 1 so as to allow for at least two operation modes. The operation modes represented by the mode signal MODE<1:n> can correspond to respective slew rates for driving a precharge voltage V_pre. Thus, the n operation modes can provide for n different slew rates at which the precharge voltage V_pre can be driven.

The voltage driving unit 400 can detect the current output of the current bias generating unit 300 and output a precharge voltage V_pre at a voltage slew rate that depends on the detected current output from the current bias generating unit 300.

Figure 3:
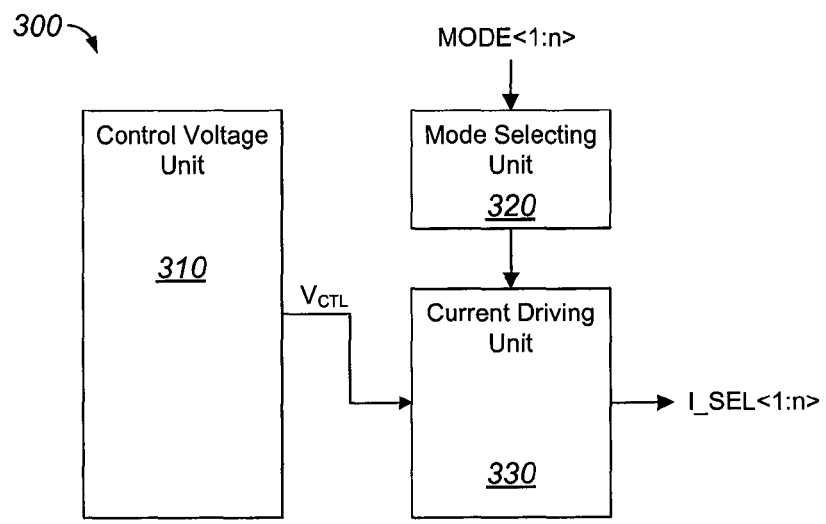
FIG. 3 shows a block diagram of an exemplary current bias generating unit capable of being implemented in the apparatus of FIG. 2.

FIG. 3 shows a block diagram of an exemplary current bias generating unit 300 capable of being implemented in the apparatus of FIG. 2. In FIG. 3, the current bias generating unit 300 can include a control voltage unit 310, a mode selecting unit 320, and current driving unit 330.

The control voltage unit 310 can be configured to provide a fixed control voltage $V_{CTL}$ to the current driving unit 330. The mode selecting unit 320 can be configured to receive the mode signal MODE<1:n> and to output a mode selection signal MODE_SEL<1:n> in response to the received mode signal MODE<1:n>. In some embodiments, the mode signal MODE<1:n> can be an n-bit parallel data signal. In alternative embodiments, the mode signal MODE<1:n> can be serial data. In some such embodiments, the current bias generating unit 300 can include known circuitry for converting the serial MODE data to parallel MODE data.

The current driving unit 330 can be configured to receive the control voltage $V_{CTL}$ from the control voltage unit 310 and to receive the mode selection signal MODE_SEL<1:n> from the mode selecting unit 320. The current driving unit 330 can be configured to output a mode selection current I_SEL in response to the mode selection signal MODE_SEL<1:n>. The current driving unit 330 can be configured to output the mode selection current I_SEL having one of a plurality of different current levels, where each of the different current levels corresponds to a respective one of the n modes. Thus, the current driving unit 330 can detect which of the n modes has been selected according to the mode selection signal MODE_SEL<1:n>, and can output the mode selection current I_SEL having the corresponding current level.

Figure 4:
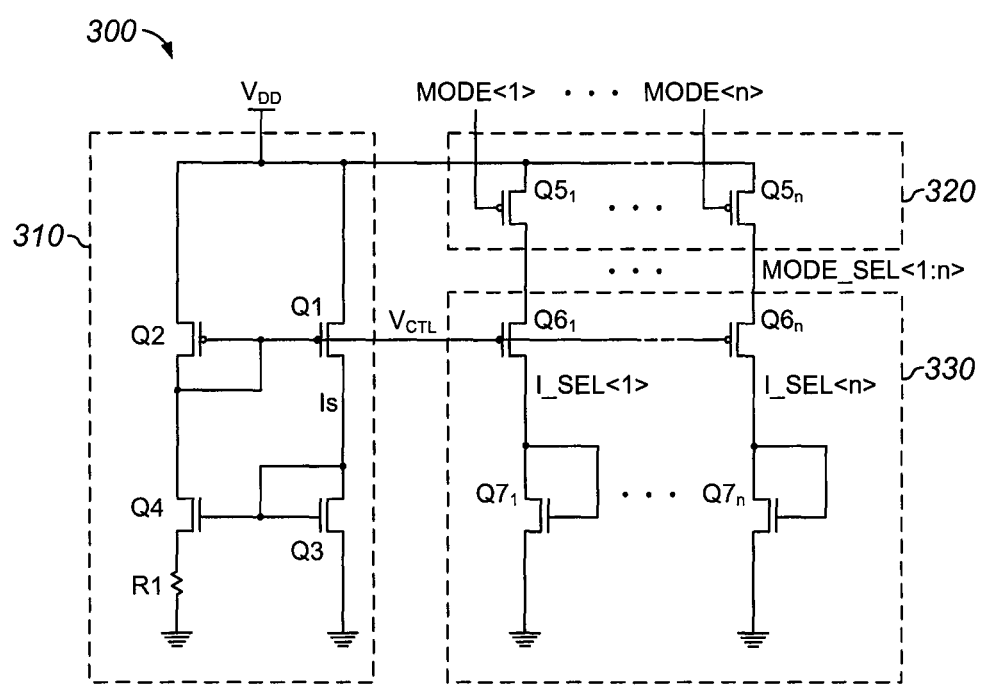
FIG. 4 shows a schematic circuit diagram of a current bias generating unit capable of being implemented in the apparatus of FIG. 3.

FIG. 4 shows a schematic circuit diagram of a current bias generating unit capable of being implemented in the apparatus of FIG. 3.

The control voltage unit 310 includes PMOS transistors Q1 and Q2, NMOS transistors Q3 and Q4, and resistor R1. The sources of transistors Q1 and Q2 are connected to a supply voltage $V_{DD}$. The gate of transistor Q1 is connected to the gate of transistor Q2, and to an output node that carries the output control voltage $V_{CTL}$. The gate of transistor Q2 is also coupled to the drain of transistor Q2. The drains of transistors Q3 and Q4 are coupled to the drains of transistors Q1 and Q2, respectively. The source of transistor Q3 is coupled to the ground potential. The source of transistor Q4 is coupled to a resistor R1, which in turn is coupled to the ground potential.

In this embodiment, the width to length (W/L) ratio, also referred to herein as aspect ratio, of transistor Q4 can be greater than the W/L ratio of transistor Q3, such that there is a ratio K between the aspect ratio ($W_{Q4}/L_{Q4}$) of transistor Q4 and the aspect ratio ($W_{Q3}/L_{Q3}$) of transistor Q3, according to Expression (1):

$$K=(W_{Q4}/L_{Q4})/(W_{Q3}/L_{Q3}) \quad (1)$$

Also, the W/L ratio of transistor Q3 is substantially the same as the W/L ratio of transistor Q1 and the W/L ratio of transistor Q2.

With the two PMOS transistors Q1 and Q2 being substantially matched, they will each carry equal driving currents Is according to Expression (2).

$$Is=(VGS_{Q3}-VGS_{Q4})/R \quad (2)$$

In Expression (2), $VGS_{Q3}$ is the gate-source voltage of transistor Q3, $VGS_{Q4}$ is the gate-source voltage of transistor Q4, and R is the resistance of resistor R1.

With the W/L ratio of transistor Q4 being greater than the W/L ratio of transistor Q3 by ratio K, the driving current Is can also be calculated according to Expression (3):

$$Is=(\zeta V_T)(\ln K)/R \quad (3)$$

In Expression (3), $\zeta$ is a nonideality factor, which is a fitting coefficient for a MOSFET operating in the sub-threshold region. $V_T$ is thermal voltage (kT/q), where k is the Boltzmann constant, T is the absolute temperature (in Kelvin), and q is the magnitude of the electrical charge (in coulombs) on the electron. K is the aspect ratio according to expression (1), and R is the resistance of resistor R1.

Thus, in the illustrated embodiment, the control voltage unit 310 includes an NMOS current mirror, formed of NMOS transistors Q3 and Q4, in combination with a positive feedback loop formed of PMOS transistors Q1 and Q2. The current mirror generates a driving current Is that is set according to the resistance of resistor R1 and the aspect ratio of transistor Q4. The control voltage unit 310 outputs a control voltage $V_{CTL}$, which is connected to the gates of the PMOS transistors Q1 and Q2, thus allowing currents within the current driving unit 330 to form current mirrors that provide respective scaled copies of the driving current Is, as described more fully below. Alternative embodiments can include other types of current drivers, including alternative current mirror circuits.

The mode selecting unit 320 includes first through nth PMOS mode-switching transistors $Q5_1$ through $Q5_n$. The sources of mode-switching transistors $Q5_1$ through $Q5_n$ are connected to the supply voltage $V_{DD}$. The drains of mode-switching transistors $Q5_1$ through $Q5_n$ provide respective mode selection signals MODE_SEL<1:n> to the current driving unit 330. The gates of mode-switching transistors $Q5_1$ through $Q5_n$ are connected to receive respective bits of the multi-bit mode signal MODE<1:n>. The signal levels of the mode signals MODE<1:n> are sufficient to control the gates of the mode-switching transistors $Q5_1$ through $Q5_n$. For example, if MODE<1> is set at a logic level "0" then the mode-switching transistor $Q5_1$ is turned on, while if MODE<1> is set at a logic level "1" then the mode-switching transistor $Q5_1$ is turned off.

The current driving unit 330 includes first through nth PMOS current-driver transistors $Q6_1$ through $Q6_n$, and first through nth diode-connected NMOS transistors $Q7_1$ through $Q7_n$. The sources of the current-driver transistors $Q6_1$ through $Q6_n$ are connected to receive respective mode selection signals MODE_SEL<1:n> from the mode selecting unit 320. The drains of the current-driver transistors $Q6_1$ through $Q6_n$ are connected to the drains and gates of respective transistors $Q7_1$ through $Q7_n$. The sources of the transistors $Q7_1$ through $Q7_n$ are coupled to the ground potential.

The gates of the current-driver transistors $Q6_1$ through $Q6_n$ are connected to receive the control voltage $V_{CTL}$ from the control voltage unit 310. As such, each of the current-driver transistors $Q6_1$ through $Q6_n$ can output a respective mode selection current I_SEL<1:n> that mirrors the driving current Is of the control voltage unit 310 according to a respective scaling factor. In this embodiment, the scaling factor is controlled according to respective aspect ratios of the current-driver transistors $Q6_1$ through $Q6_n$. That is, the W/L ratio of each of the current-driver transistors $Q6_1$ through $Q6_n$ can be designed such that each mode selection current value I_SEL<1:n> can be a respective fraction of the driving current Is. Thus, the mode selection currents I_SEL<1:n> can be scaled such that I_SEL<1>=($K_1$)(Is), I_SEL<2>=($K_2$)(Is), ... I_SEL<n>=($K_n$)(Is), for n possible current values, where $K_1$ through $K_n$ are respective different values such that for each of n values of K, 1>K>0.

Operation of the current bias generating unit 300 will be described for an embodiment having four modes (i.e., n=4), but the description applies equally to alternative embodiments having additional or fewer modes. In the four-mode example, the mode signal MODE<1:n> is a 4-bit mode signal MODE<1:4>, and the mode selecting unit 320 includes four mode-switching transistors $Q5_1$ through $Q5_4$. Also, the current driving unit 330 includes four current-driver transistors $Q6_1$ through $Q6_4$ and four diode-connected transistors $Q7_1$ through $Q7_4$.

In parallel, the gate of the first mode-switching transistor $Q5_1$ can receive the first bit MODE<1>, the gate of the second mode-switching transistor $Q5_2$ can receive the second bit MODE<2>, the gate of the third mode-switching transistor $Q5_3$ can receive the third bit MODE<3>, and the gate of the fourth mode-switching transistor $Q5_4$ can receive the fourth bit MODE<4>.

In such an embodiment, an example of a received mode signal MODE<1:4> can be "0111" so that the gate of the first mode-switching transistor $Q5_1$ receives "0" as the first bit MODE<1>, the gate of the second mode-switching transistor $Q5_2$ receives "1" as the second bit MODE<2>, the gate of the third mode-switching transistor $Q5_3$ receives "1" as the third bit MODE<3>, and the gate of the fourth mode-switching transistor $Q5_4$ receives "1" as the fourth bit MODE<4>. In this example, the first mode-switching transistor $Q5_1$ will be turned on, while the remaining mode-switching transistors $Q5_2$ through $Q5_4$ are turned off. Alternative embodiments can include fewer or additional modes and transistors Q5.

Meanwhile, the control voltage unit 310 receives a supply voltage $V_{DD}$, and outputs the control voltage $V_{CTL}$ to the gates of the current-driver transistors $Q6_1$ through $Q6_4$. However, since only the first mode-switching transistor $Q5_1$ is turned on, only the mode selection current value I_SEL<1> is allowed to flow. The current level of the mode selection current value I_SEL<1> is a scaled mirror of the driving current Is, where the scaling of the driving current Is is set according to the aspect ratio of the current-driver transistors $Q6_1$. In a similar manner, the mode signal MODE<1:n> can be changed to turn on any of the desired mode selection currents I_SEL<1:4> according to a desired output current level.

Figure 5:
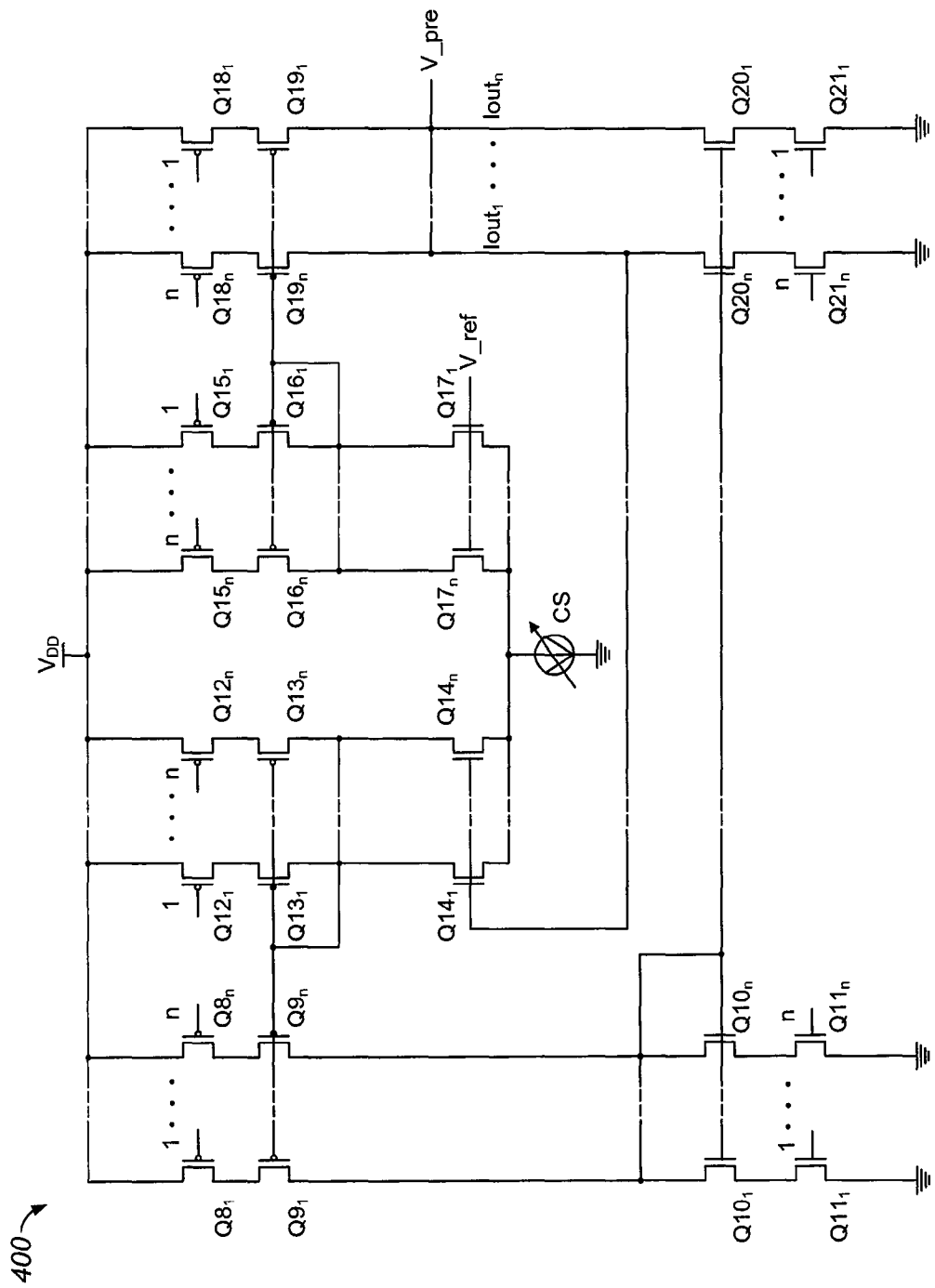
FIG. 5 shows a schematic circuit diagram of a voltage driving unit capable of being implemented in the apparatus of FIG. 2.

FIG. 5 shows a schematic circuit diagram of a voltage driving unit 400 capable of being implemented in the apparatus of FIG. 2. The circuitry shown in FIG. 5 includes a current mirror opamp-based regulator. Alternative embodiments of the voltage driving unit 400 can alternatively be based on a folded-cascode opamp or any other similar configuration.

The voltage driving unit 400 includes several transistor groups Q8 through Q21. The transistor groups Q8 through Q21 include PMOS transistors $Q8_{1-n}$, $Q9_{1-n}$, $Q12_{1-n}$, $Q13_{1-n}$, $Q15_{1-n}$, $Q16_{1-n}$, $Q18_{1-n}$, and $Q19_{1-n}$, and NMOS transistors $Q10_{1-n}$, $Q11_{1-n}$, $Q14_{1-n}$, $Q17_{1-n}$, $Q20_{1-n}$, and $Q21_{1-n}$. Each of the transistor groups Q8 through Q21 includes n transistors, where n is equal to the number of n bits of the mode signal MODE<1:n> and of the mode selection signal MODE_SEL<1:n>.

The gates of transistors $Q8_{1-n}$, $Q11_{1-n}$, $Q12_{1-n}$, $Q15_{1-n}$, $Q18_{1-n}$, and $Q21_{1-n}$ receive the mode signal MODE<1:n>. More specifically, the gates of transistors $Q8_{1-n}$ each receives a respective bit of the mode signal MODE<1:n>, the gates of transistors $Q11_{1-n}$ each receives a respective bit of the mode signal MODE<1:n>, the gates of transistors $Q12_{1-n}$ each receives a respective bit of the mode signal MODE<1:n>, the gates of transistors $Q15_{1-n}$ each receives a respective bit of the mode signal MODE<1:n>, the gates of transistors $Q18_{1-n}$ each receives a respective bit of the mode signal MODE<1:n>, and the gates of transistors $Q21_1$, each receives a respective bit of the mode signal MODE<1:n>.

The gates of transistors $Q9_{1-n}$ are connected to the gates of transistors $Q13_{1-n}$, which are also connected to the drains of transistors $Q13_{1-n}$. The drains of transistors $Q13_{1-n}$ are also connected to respective drains of transistors $Q14_{1-n}$. The gates of transistors $Q10_{1-n}$ are connected to the gates of transistors $Q20_{1-n}$, and to the drains of transistors $Q10_{1-n}$. The sources of transistors $Q10_{1-n}$ are connected to respective drains of transistors $Q11_{1-n}$. The gates of transistors $Q14_{1-n}$ are connected to an output node between the drains of transistors $Q19_{1-n}$ and the drains of transistors $Q20_{1-n}$. The gates of transistors $Q16_{1-n}$ are connected to the gates of transistors $Q19_{1-n}$, and to the drains of transistors $Q16_{1-n}$. The drains of transistors $Q16_{1-n}$ are also connected to respective drains of transistors $Q17_{1-n}$.

The gates of the transistors $Q17_{1-n}$ are connected to receive a reference voltage V_ref. The reference voltage V_ref can be at least substantially equal to the desired output voltage V_pre. The reference voltage V_ref can be generated according to known methods, for example using a known bandgap or other type of reference voltage circuit.

The sources of the transistors $Q14_{1-n}$ and $Q17_{1-n}$ are connected to a current source CS, which is representative of the current signals I_SEL<1:n>. In other words, the sources of transistors $Q14_1$ and $Q17_1$ are connected to receive I_SEL<1>, the sources of transistors $Q14_2$ and $Q17_2$ are connected to receive I_SEL<2>, and so on for n transistors and current sources.

Figure 1A:
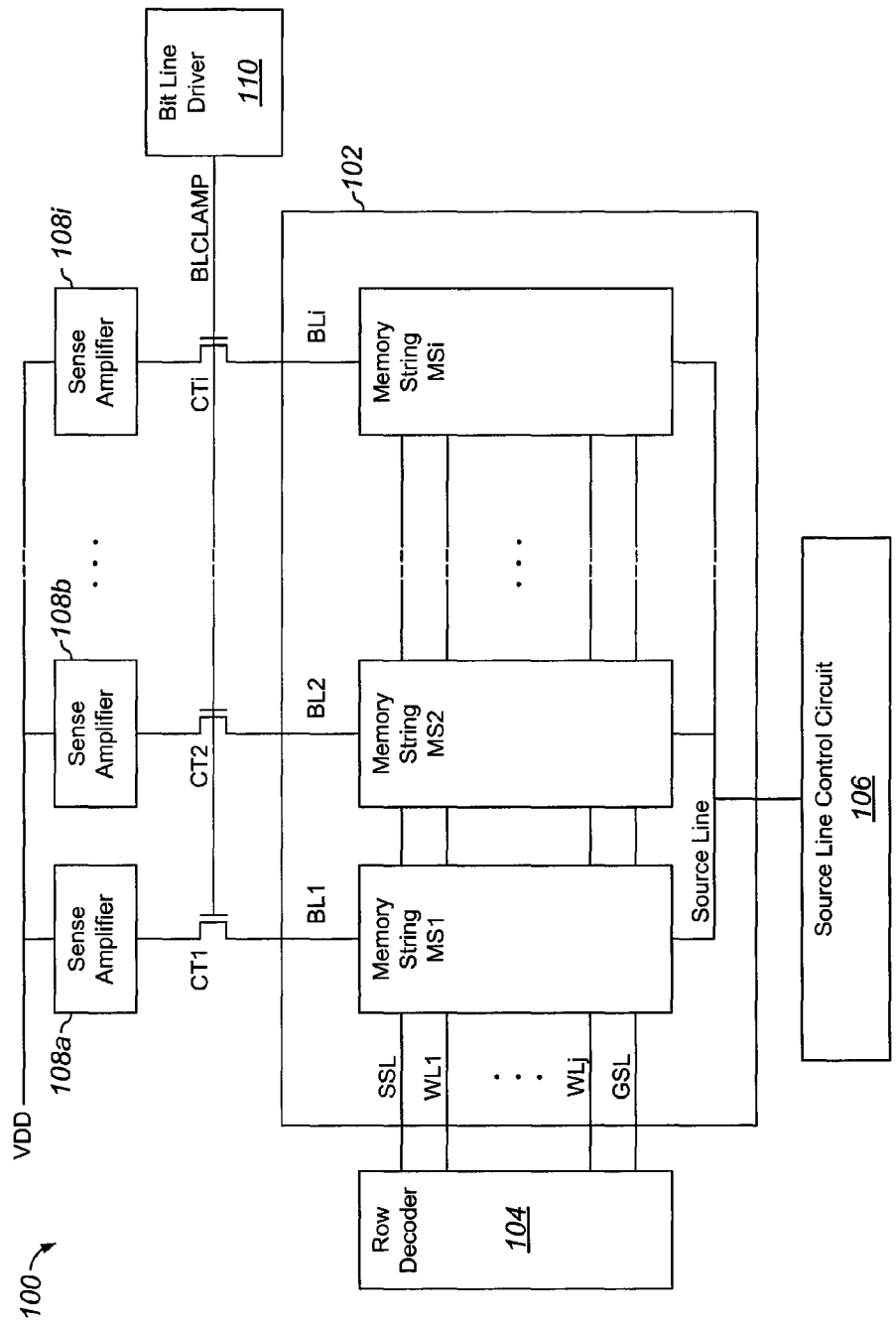
FIG. 1A shows a block diagram of components of a NAND flash memory device.
Figure 1B:
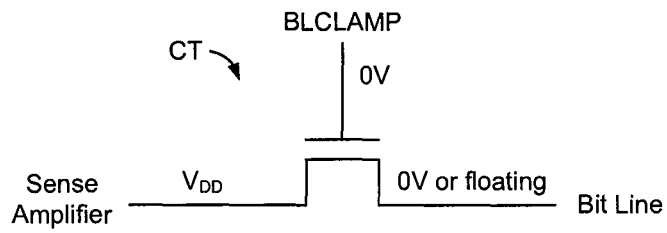
FIGS. 1B and 1C show a clamp transistor of the NAND flash memory device shown in FIG. 1A.
Figure 1C:
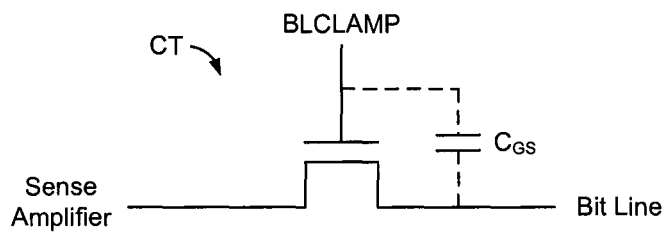
Figure 1D:
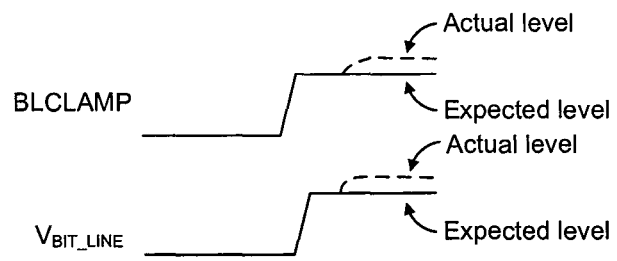
FIG. 1D shows signals associated with the clamp transistor shown in FIGS. 1B and 1C.
Figure 6:
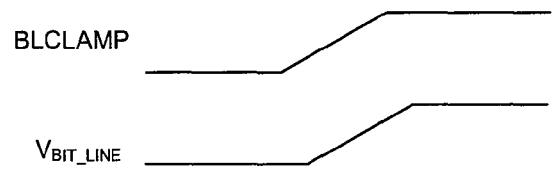
FIG. 6 shows signals associated with a clamp transistor driven by the output voltage driving circuit shown in FIG. 2.

As with the transistors of the current driving unit 330, the transistors of the voltage driving unit can also have different aspect ratios. Specifically, each of the 1-n transistors in each transistor group Q8-Q21 can have a respective aspect ratio, which provide respective output driving conditions $I_{out}/C_{out}$, where $I_{out}$ is the output node current and $C_{out}$ is the output load capacitance. A voltage V_pre driven at the output node will be driven at a slew rate SR depending on which of the stages 1-n is activated by the mode signal MODE<1:n>. In some embodiments, the voltage V_pre can be a voltage that is used to pre-charge a memory device control line, for example V_pre can be used to pre-charge a bit line in a flash memory device. Each stage is configured to provide a respective different one of currents $Iout_{1-n}$ at the output node. The slew rate of the voltage V_pre will thus be driven at a slew rate $SR=I_{out}/C_{out}$, where the output current $I_{out}$ is equal to one of $Iout_{1-n}$ depending on which stage is activated. Thus, for operations where coupling effect in a memory device is less of a concern, or not a concern, the slew rate SR of the pre-charge voltage V_pre can be increased, and can have a steep transition as shown in FIG. 1D. On the other hand, for operations where the coupling effect is more of a concern, the slew rate of the pre-charge voltage can be decreased, by controlling the mode signal MODE<1:n>, resulting in a slower transition as shown in FIG. 6, thereby reducing or eliminating the unwanted voltage increases shown in FIG. 1D.

The respective currents $Iout_{1-n}$ of the stages 1-n of the voltage driving unit 400 can be configured to vary based on respective aspect ratios of the transistors in the stages 1-n. That is, the W/L ratio of each of the current-driver transistors $Q<8-21>_1$ through $Q<8-21>_n$ can be designed such that each output current value $Iout_{1-n}$ can be a respective fraction of the driving current Is of the control voltage unit 310.

Figure 7:
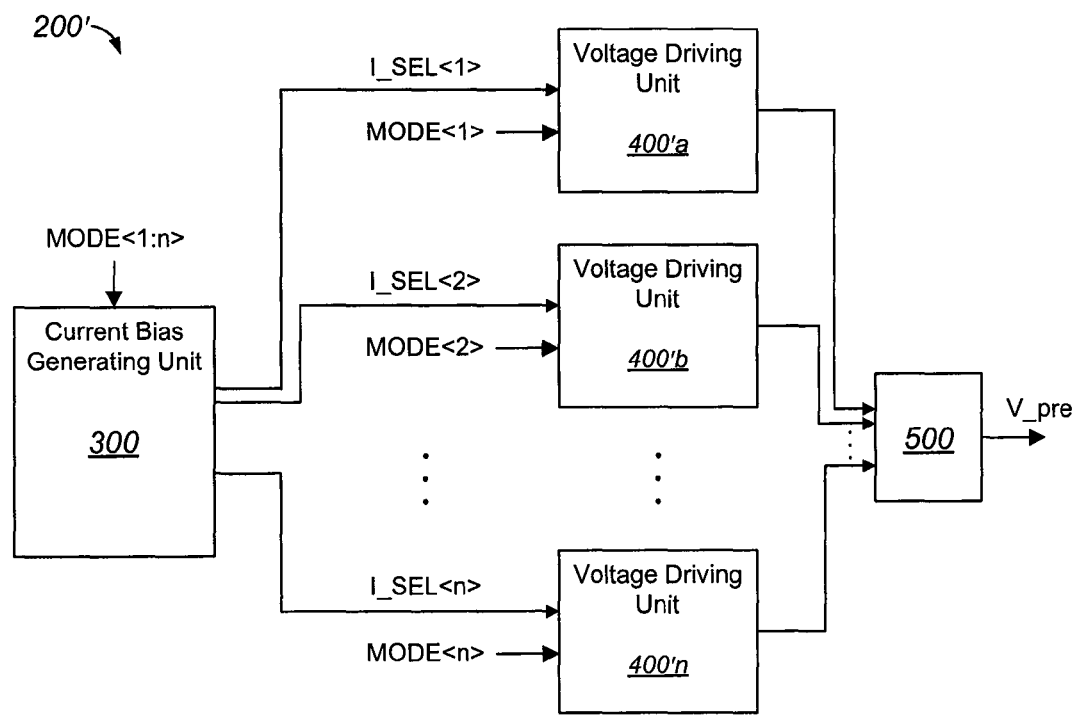
FIG. 7 shows a block diagram of an alternative embodiment of an output voltage driving circuit of a semiconductor memory apparatus.

It will be appreciated that various alternative embodiments are possible without departing from the spirit and scope of the present disclosure. For example, referring to FIG. 7, an alternative voltage driving circuit 200' is shown that is substantially similar to the voltage driving circuit 200 described above, except that the voltage driving circuit 200' includes multiple voltage driving units 400'a through 400'n. The voltage driving units 400'a through 400'n receive respective bits of the 1 through n bits of the mode signal MODE<1:n>. Also, each voltage driving unit 400'a through 400'n receives a respective one of the mode selection currents I_SEL<1:n>. The voltage driving units 400'a through 400'n can be similar to the voltage driving unit 400, except that the voltage driving units 400'a through 400'n are single-stage rather than multi-stage. Also, each of the voltage driving units 400'a through 400'n includes respective groups of transistors have respective different aspect ratios. Thus, the embodiment shown in FIG. 5 includes multiple voltage driving units 400'a through 400'n rather than one multi-stage voltage driving unit 400. Due to the differences in aspect ratios of transistors of the respective voltage driving units 400'a through 400'n, each of the voltage driving units 400'a through 400'n can output a voltage V_pre having a respective different slew rate. The voltage driving units 400'a through 400'n are activated to output V_pre by the respective bit of the mode signal MODE<1:n>. The outputs of the voltage driving units 400'a through 400'n can be connected to an output buffer 500 for outputting the voltage V_pre received from any of the voltage driving units 400'a through 400'n. The output buffer 500 can include, for example, cascaded tri-state outputs that includes a series of MOSFETS for outputting a signal received from any of the voltage driving units 400'a through 400'n.

While various embodiments in accordance with the disclosed principles have been described above, it should be understood that they have been presented by way of example only, and are not limiting. Thus, the breadth and scope of the invention(s) should not be limited by any of the above-described exemplary embodiments, but should be defined only in accordance with the claims and their equivalents issuing from this disclosure. Furthermore, the above advantages and features are provided in described embodiments, but shall not limit the application of such issued claims to processes and structures accomplishing any or all of the above advantages.

Additionally, the section headings herein are provided for consistency with the suggestions under 37 C.F.R. 1.77 or otherwise to provide organizational cues. These headings shall not limit or characterize the invention(s) set out in any claims that may issue from this disclosure. Specifically and by way of example, although the headings refer to a "Technical Field," such claims should not be limited by the language chosen under this heading to describe the so-called technical field. Further, a description of a technology in the "Background" is not to be construed as an admission that technology is prior art to any invention(s) in this disclosure. Neither is the "Summary" to be considered as a characterization of the invention(s) set forth in issued claims. Furthermore, any reference in this disclosure to "invention" in the singular should not be used to argue that there is only a single point of novelty in this disclosure. Multiple inventions may be set forth according to the limitations of the multiple claims issuing from this disclosure, and such claims accordingly define the invention(s), and their equivalents, that are protected thereby. In all instances, the scope of such claims shall be considered on their own merits in light of this disclosure, but should not be constrained by the headings set forth herein.

What is claimed is:

1. A voltage driving circuit, comprising:
   a current bias generating unit configured to receive a signal and to generate a selection current in response to the signal; and
   a voltage driving unit coupled to the current bias generating unit, the voltage driving unit being configured to receive the selection current and to drive an output voltage at a slew rate that is set according to the selection current.

2. The circuit of claim 1, wherein the signal includes n bits, where n is an integer greater than 1.

3. The circuit of claim 2, wherein the voltage driving unit further receives the signal.

4. The circuit of claim 3, wherein the voltage driving unit is configured to drive the output voltage at the slew rate corresponding to one of n operation modes, wherein each of the n operation modes allows for a respective different slew rate.

5. The circuit of claim 1, wherein the current bias generating unit comprises:
   a control voltage unit configured to generate a driving current and a control voltage;
   a selecting unit configured to receive the signal and output a selection signal; and
   a current driving unit configured to receive the selection signal and to generate one of a plurality of possible selection currents based on the selection signal.

6. The circuit of claim 5, wherein the plurality of selection currents includes first and second selection currents, wherein the current driving unit comprises first and second transistors having respective first and second aspect ratios, wherein each of the first and second transistors is configured to drive a respective one of the first and second selection currents.

7. The circuit of claim 6, wherein the control voltage unit comprises a current mirror circuit configured to generate the driving current.

8. The circuit of claim 7, wherein the respective magnitudes of the first and second selection currents are related to the magnitude of the driving current and the aspect ratio of the respective one of the first and second transistors.

9. The circuit of claim 1, wherein the voltage driving unit comprises a current mirror opamp-based regulator.

10. The circuit of claim 9, wherein the voltage driving unit comprises a plurality of stages, wherein the slew rate depends on which of the stages is activated by the selection signal.

11. The circuit of claim 1, further comprising a second voltage driving unit coupled to the current bias generating unit, wherein the current bias generating unit is further configured generate a second selection current in response to the signal, wherein the second voltage driving unit is configured to receive the second selection current and to drive an output voltage at a second slew rate that is set according to the second selection current.

12. A voltage driving circuit, comprising:
   a current bias generating unit configured to receive a signal and to generate a selection current in response to the signal; and
   a voltage driving unit coupled to the current bias generating unit, the voltage driving unit comprising a plurality of stages, each stage being configured to drive an output voltage at a respective one of a plurality of different slew rates according to the signal.

13. The circuit of claim 12, wherein the signal includes n bits, where n is an integer greater than 1.

14. The circuit of claim 13, wherein the voltage driving unit is configured to receive the signal.

15. The circuit of claim 14, wherein the voltage driving unit is configured to drive the output voltage at one of n different slew rates, wherein each bit of the signal corresponds to a respective one of the n different slew rates.

16. The circuit of claim 12, wherein the current bias generating unit comprises:
   a control voltage unit configured to generate a driving current and a control voltage;
   a selecting unit configured to receive the signal and output a selection signal; and
   a current driving unit configured to receive the selection signal and to generate one of a plurality of possible selection currents based on the selection signal.

17. The circuit of claim 16, wherein the plurality of selection currents includes first and second selection currents, wherein the current driving unit comprises first and second transistors having respective first and second aspect ratios, wherein each of the first and second transistors is configured to drive a respective one of the first and second selection currents.

18. The circuit of claim 17, wherein the control voltage unit comprises a current mirror circuit configured to generate the driving current.

19. The circuit of claim 18, wherein the respective magnitudes of the first and second selection currents are related to the magnitude of the driving current and the aspect ratio of the respective one of the first and second transistors.

20. The circuit of claim 12, wherein the voltage driving unit comprises a current mirror opamp-based regulator.

* * * * *